United States Patent
Dip (10) Patent No.: US 7,635,655 B2
(45) Date of Patent: Dec. 22, 2009

(54) METHOD FOR REPLACING A NITROUS OXIDE BASED OXIDATION PROCESS WITH A NITRIC OXIDE BASED OXIDATION PROCESS FOR SUBSTRATE PROCESSING

(75) Inventor: Anthony Dip, Cedar Creek, TX (US)

(73) Assignee: Tokyo Electron Limited, Tokyo (JP)

( * ) Notice: Subject to any disclaimer, the term of this patent is extended or adjusted under 35 U.S.C. 154(b) by 485 days.

(21) Appl. No.: 11/278,054

(22) Filed: Mar. 30, 2006

(65) Prior Publication Data

US 2007/0238313 A1 Oct. 11, 2007

(51) Int. Cl.
*H01L 21/31* (2006.01)
(52) U.S. Cl. .............. 438/769; 438/775; 257/E21.267
(58) Field of Classification Search .............. 438/769, 438/770, 775, 765; 257/E21.267, E21.268
See application file for complete search history.

(56) References Cited

U.S. PATENT DOCUMENTS

| | | | |
|---|---|---|---|
| 5,407,870 A | 4/1995 | Okada et al. | |
| 5,512,519 A | 4/1996 | Hwang | |
| 5,786,254 A | 7/1998 | Hao et al. | |
| 5,808,398 A | 9/1998 | Stoffels et al. | |
| 5,939,763 A | 8/1999 | Hao et al. | |
| 6,001,694 A | 12/1999 | Shih et al. | |
| 6,188,110 B1 | 2/2001 | Gardner et al. | |
| 6,248,628 B1 | 6/2001 | Halliyal et al. | |
| 6,251,801 B1 * | 6/2001 | Saki et al. .......... | 438/769 |
| 6,258,730 B1 | 7/2001 | Sun et al. | |
| 6,261,925 B1 | 7/2001 | Arghavani et al. | |
| 6,436,848 B1 | 8/2002 | Ramkumar | |
| 6,450,116 B1 | 9/2002 | Noble et al. | |
| 6,649,537 B1 | 11/2003 | Reder et al. | |
| 6,692,249 B1 | 2/2004 | Beatty et al. | |
| 6,706,643 B2 | 3/2004 | Tay et al. | |
| 6,767,843 B2 | 7/2004 | Lipkin et al. | |

(Continued)

FOREIGN PATENT DOCUMENTS

WO 02101809 12/2002

(Continued)

OTHER PUBLICATIONS

Ellis, K.A. et al., Nitrous Oxide (N2O) Processing for Silicon Oxynitride Gate Dieletrics, IBM J. Res. Develop. vol. 43, No. 3, May 1999, pp. 287-300.

(Continued)

*Primary Examiner*—Brook Kebede
(74) *Attorney, Agent, or Firm*—Wood, Herron & Evans LLP (57) ABSTRACT

A method for performing an oxidation process on a plurality of substrates in a batch processing system. According to one embodiment, the method includes selecting a $N_2O$-based oxidation process for the substrates including a first process gas containing $N_2O$ that thermally decomposes in a process chamber of the batch processing system to $N_2$, $O_2$, and NO byproducts, and generating a replacement NO-based oxidation process for the substrates including a second process gas containing $N_2$, $O_2$, and NO with molar concentrations that mimic that of the $N_2$, $O_2$, and NO byproducts in the $N_2O$-based oxidation process. According to another embodiment of the invention, the NO-based oxidation process contains NO, $O_2$, and an inert gas.

21 Claims, 7 Drawing Sheets

U.S. PATENT DOCUMENTS

| | | |
|---|---|---|
| 6,864,125 B2 | 3/2005 | Sandhu et al. |
| 6,929,699 B2 | 8/2005 | Whitesell |
| 6,939,756 B1 | 9/2005 | Chung et al. |
| 2002/0172774 A1 | 11/2002 | Lipkin |
| 2002/0197884 A1 | 12/2002 | Niimi et al. |
| 2003/0015763 A1 | 1/2003 | Yoneda |
| 2003/0042526 A1 | 3/2003 | Weimer |
| 2003/0201504 A1* | 10/2003 | Ibrahim et al. ............... 257/410 |
| 2005/0208775 A1 | 9/2005 | Lin |

FOREIGN PATENT DOCUMENTS

| | | |
|---|---|---|
| WO | 03058695 | 7/2003 |
| WO | 2004025719 | 3/2004 |

OTHER PUBLICATIONS

Dang, Sanjit Singh et al., Nitrous Oxide-Based Progressive Silicon Oxynitridation in Furnaces of Different Dimensions, Advanced Materials Research Laboratory, Department of Chemical Engineering, University of Illinois at Chicago, Chicago, IL 60607, Undated, 5 pages.

European Patent Office, Search Report in PCT/US2007/064464, Aug. 3, 2007, 3 pages.

Chang, et al, "X-Ray Photoelectron Studies of Oxynitrides for Gate Applications", Electrochemical Society Proceedings, vol. 99-6, 1999, pp. 193-206.

* cited by examiner

METHOD FOR REPLACING A NITROUS OXIDE BASED OXIDATION PROCESS WITH A NITRIC OXIDE BASED OXIDATION PROCESS FOR SUBSTRATE PROCESSING

FIELD OF THE INVENTION

The present invention relates to semiconductor substrate processing and, more particularly, to a method for replacing a nitrous oxide-based ($N_2O$-based) oxidation process used with a nitric oxide-based (NO-based) oxidation process.

BACKGROUND OF THE INVENTION

In the formation of integrated circuits on the surface of a semiconductor substrate, oxide or oxynitride layers are frequently grown or deposited over the surface of a crystalline substrate such as silicon. Oxide or oxynitride layers may have superior electrical properties, including high electron mobility and low electron trap densities, that are desirable for device operation in semiconductor applications. Several methods have been developed for forming oxide and oxynitride layers for semiconductor applications and, following formation of these layers on a substrate, oxide and oxynitride layers are frequently annealed in to further improve their material and electrical properties.

In one example, a thin oxide layer may be annealed in the presence of a nitrogen-containing gas, such as nitrous oxide ($N_2O$), at predetermined processing conditions to form an oxynitride layer by nitrogen incorporation from the gas into the oxide layer. In another example, an oxynitride layer may be formed on a substrate by annealing a clean substrate in the presence of a $N_2O$ gas. However, one serious shortcoming associated with using a $N_2O$ gas for oxide annealing and nitrogen incorporation is tool-to-tool variability among similar or dissimilar processing tools and processing tool configurations. Tool-to-tool variability can result in unacceptable thickness variations and different nitrogen depth profiles in the oxynitride layers. In other words, processing tool A may have different process results as compared to processing tool B, even if the same $N_2O$ oxidation process recipe and hardware configuration are used.

Potential solutions to these shortcomings associated with $N_2O$ annealing include tighter control on hardware design and manufacturing, in particular with respect to quartz system components commonly used in batch processing tools. However, this is an expensive and impractical option because quartz system components are often manufactured by hand.

There is thus a need for new methods that reduce or eliminate these and other shortcomings and disadvantages associated with $N_2O$-based oxidation processes.

SUMMARY OF THE INVENTION

Generally, a method is provided for performing an oxidation process on a plurality of substrates in a batch processing system. In particular, a method is provided for replacing a $N_2O$-based oxidation process used for substrate processing with a NO-based oxidation process. According to one embodiment of the invention, a $N_2O$-based oxidation process may be selected and a replacement NO-based oxidation process determined by chemical modeling or by direct measurements of the byproducts of the $N_2O$-based oxidation process in the process chamber, or by comparing oxidation results of $N_2O$-based and NO-based oxidation processes.

According to one embodiment of the invention, the method includes selecting a $N_2O$-based oxidation process including a first process gas containing $N_2O$ that thermally decomposes in a process chamber of the batch processing system to $N_2$, $O_2$, and NO byproducts, and generating a replacement NO-based oxidation process including a second process gas containing $N_2$, $O_2$, and NO with molar concentrations that mimic that of the $N_2$, $O_2$, and NO byproducts in the $N_2O$-based oxidation process. The method may further include placing a plurality of substrates in a process chamber of the batch processing system, and performing the NO-based oxidation process on the plurality of substrates by introducing the second process gas into the process chamber.

According to another embodiment of the invention, the method includes selecting a $N_2O$-based oxidation process including a first process gas containing $N_2O$ that thermally decomposes in a process chamber of the batch processing system to $N_2$, $O_2$, and NO byproducts, and generating a replacement NO-based oxidation process including a second process gas containing NO, $O_2$, and a dilution gas, where the molar concentrations of NO and $O_2$ in the second process gas mimic that of the $N_2O$-based oxidation process. The method may further include placing a plurality of substrates in a process chamber of the batch processing system, and performing the NO-based oxidation process on the plurality of substrates by introducing the second process gas into the process chamber.

BRIEF DESCRIPTION OF THE DRAWINGS

The accompanying drawings, which are incorporated in and constitute a part of this specification, illustrate embodiments of the invention and, together with a general description of the invention given above, and the detailed description given below, serve to explain the invention.

DETAILED DESCRIPTION

Embodiments of the present invention relate to semiconductor substrate processing, and more particularly, to a method for replacing a nitrous oxide ($N_2O$)-based oxidation process used for substrate processing with a nitric oxide (NO)-based oxidation process. As used herein, a $N_2O$-based (NO-based) oxidation process refers to a process of flowing a process gas containing $N_2O$ (NO) into a process chamber containing a plurality of substrates to be processed. The substrate processing can include forming an oxynitride layer on the substrate or performing a reoxidation process on a substrate containing an oxide or oxynitride layer formed thereon.

In a $N_2O$-based oxidation process, a process gas containing $N_2O$ is flowed into a heated process chamber. The $N_2O$ thermally decomposes in the process chamber into $N_2$, $O_2$, and NO byproducts (reaction products) that provide the oxidation environment for the plurality of substrates in the process chamber exposed to the byproducts. However, the relative concentrations of the byproducts in the process chamber, and hence the oxidation environment and the resulting oxynitride layer thickness and composition profile, is strongly influenced by several factors, including the concentration of the $N_2O$ gas in the process gas (e.g., undiluted $N_2O$ or diluted $N_2O$), the process gas flow rate, the gas residence time and the gas temperature in the process chamber, position of substrates in the process chamber, and the physical dimensions and configuration of the process chamber. This is due to the highly exothermic nature of the thermal decomposition of $N_2O$ gas into byproducts that include $N_2$, $O_2$, and NO. This difference in the oxidation environment results in tool-to-tool variability among similar or dissimilar processing tools and processing tool configurations and can result in unacceptable variations in the resulting oxynitride layer thickness and the nitrogen depth profile within the oxynitride layer.

As described above, new oxidation processes are needed that reduce or eliminate the above-mentioned shortcomings associated with $N_2O$-based oxidation processing. The present invention is premised on the realization that for a predetermined $N_2O$-based oxidation process (recipe), an equivalent NO-based oxidation process exists and may be used to reduce or eliminate many of the above-mentioned drawbacks associated with a $N_2O$-based oxidation process.

According to one embodiment, the method includes selecting a $N_2O$-based oxidation process including a first process gas containing $N_2O$ that thermally decomposes in a process chamber of the batch processing system to $N_2$, $O_2$, and NO byproducts, and generating a replacement NO-based oxidation process including a second process gas containing $N_2$, $O_2$, and NO with molar concentrations that mimic (i.e., copy or closely resemble; are substantially identical to) the molar concentrations of the $N_2$, $O_2$, and NO byproducts in the $N_2O$-based oxidation process. The method may further include placing a plurality of substrates in a process chamber of the batch processing system, and performing the NO-based oxidation process on the plurality of substrates by introducing the second process gas into the process chamber.

According to another embodiment, the method includes selecting a $N_2O$-based oxidation process including a first process gas containing $N_2O$ that thermally decomposes thermally decomposes in a process chamber of the batch processing system to $N_2$, $O_2$, and NO byproducts, generating a replacement NO-based oxidation process comprising a second process gas containing NO, $O_2$, and a dilution gas, wherein the molar concentrations of NO and $O_2$ in the second process gas mimic that of the $N_2O$-based oxidation process. The method may further include placing a plurality of substrates in a process chamber of the batch processing system; and performing the NO-based oxidation process on the plurality of substrates by introducing the second process gas into the process chamber. The dilution gas can include at least one of $N_2$ or Ar. According to one embodiment of the invention, the first process gas consists of $N_2O$. According to another embodiment of the invention, the first process gas includes $N_2O$ and at least one of $N_2$, $O_2$, or Ar.

$N_2O$-based process gases have certain disadvantages in comparison with NO-based oxidation processes. In particular, NO production from $N_2O$ decomposition is dependent on gas temperature and, thus, the characteristics of the gas injection. Therefore, if the method of gas injection varies or if injector differences exist between tools, the NO concentration will also vary in the process chambers of the tools. For comparison, NO-based oxidation processes are relatively insensitive to hardware variability and can be used to mimic $N_2O$-based oxidation results with less consideration to hardware design or injection method.

According to one embodiment of the invention, a $N_2O$-based oxidation process may be selected and the equivalent replacement NO-based oxidation process may be determined by chemical modeling or by direct measurement of the byproducts of the $N_2O$-based oxidation process in the process chamber, or by comparing oxidation results of $N_2O$-based and NO-based oxidation processes.

Chemical modeling of different $N_2O$-based oxidation processes in a process chamber of a batch processing system was performed using a subset of a combustion chemical model from Gas Research Institute, 8600 West Bryn Mawr Avenue, Chicago, Ill. The GRI-Mech Version 3.0 natural gas combustion software (available at http://www.me.berkeley.edu/gri_mech) is an optimized chemical reaction mechanism capable of representing, among others, natural gas flame profiles and ignition profiles. Thermal decomposition of $N_2O$ is highly exothermic and resembles that of flame dynamics, for example $H_2/O_2$ flame dynamics.

The chemical model subset included the 8 reversible equations listed below:

$$2O+M \leftrightarrow O_2+M$$

$$N+NO \leftrightarrow N_2+O$$

$$N+O_2 \leftrightarrow NO+O$$

$$N_2O+O_2 \leftrightarrow N_2+O_2$$

$$N_2O+O \leftrightarrow 2NO$$

$$N_2O(+M) \leftrightarrow N_2+O(+M)$$

$$NO+O+M \leftrightarrow NO_2+M$$

$$NO_2+O \leftrightarrow NO+O_2$$

where M represents a moderator, otherwise known as a third body, which, when present, may effect a change in the reaction rate of one of the above reactions.

Figure 1:
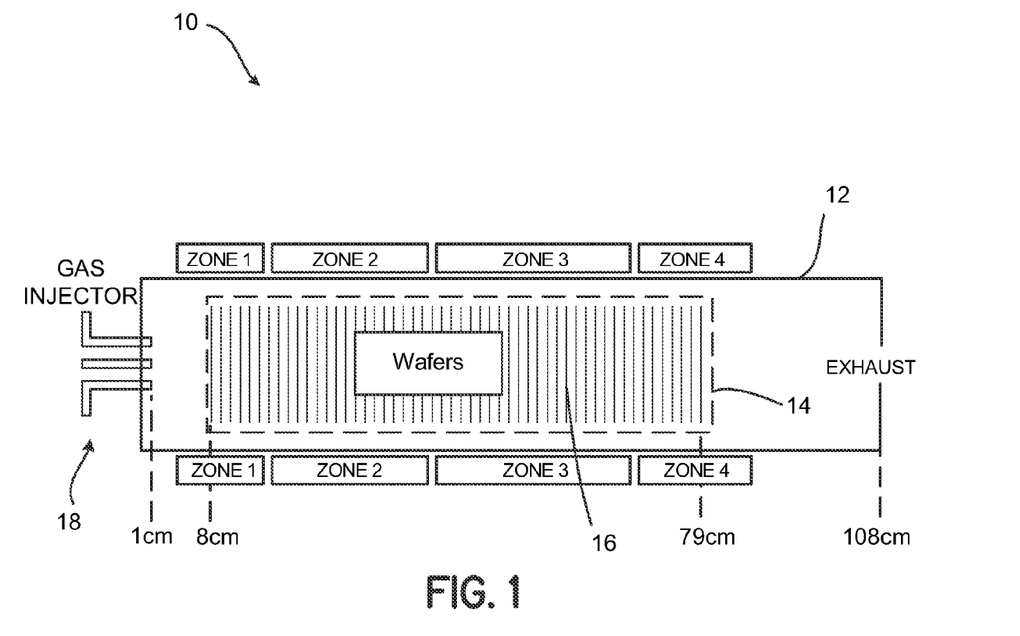
FIG. 1 schematically shows a cross-sectional view of a batch processing system configured to process plurality of substrates according to an embodiment of the invention.

FIG. 1 schematically shows a cross-sectional view of a batch processing system configured to process a plurality of substrates according to an embodiment of the invention. The configuration of the batch processing system 10 was utilized to chemically model the byproduct distribution in the process chamber (tube) 12 for different $N_2O$-based oxidation processes containing different $N_2O$-based process gases. For purposes of the modeling, the process chamber 12 was 108 cm in length with an inner diameter of 273 mm for processing 200 mm diameter substrates (wafers).

The chemical modeling included flowing a $N_2O$-based process gas into the process chamber 12 using a gas injector 18 positioned about 1 cm from the gas injection end of the process chamber 12. Although not a part of the chemical modeling, a substrate holder 14 configured to support a plurality of wafers 16 is depicted at a typical position in the process chamber 12. The wafers 16 are positioned at a distance between 8 cm and 79 cm from the gas injection end of the process chamber 12. In FIG. 1, the substrate holder 14 is configured to support 138 wafers having that are spaced 5.2 mm apart. The processing conditions used in the chemical modeling included a process chamber temperature of 900° C. and a process gas pressure of 615 Torr in the process chamber 12. FIG. 1 further shows four heater zones for heating the process chamber 12 to the predetermined process temperature.

Figure 2:
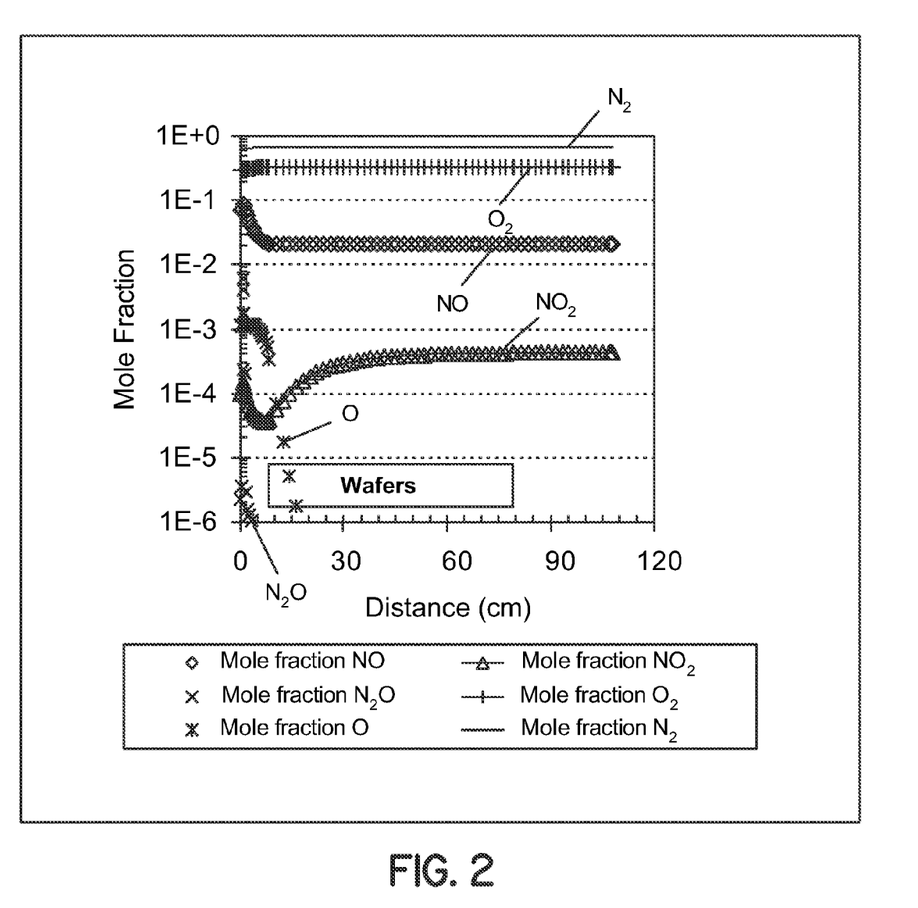
FIG. 2 shows mole fractions of byproducts from thermal decomposition of an undiluted $N_2O$ process gas in a process chamber according to an embodiment of the invention.

FIG. 2 shows mole fractions of byproducts from thermal decomposition of an undiluted $N_2O$ process gas in a process chamber according to an embodiment of the invention. The mole fractions are plotted as a function of the distance from the gas injector 18 in the process chamber 12 (FIG. 1). The chemical modeling results shown in FIG. 2 correspond to byproducts of a process gas consisting of a 10 slm $N_2O$. FIG. 2 shows that thermal decomposition of $N_2O$ in the process chamber primarily yields $N_2$, $O_2$, and NO byproducts. In fact, the combined amount of $N_2$, $O_2$, and NO accounts for the vast majority (99.96%) of the byproducts formed. Minor byproducts from the thermal decomposition of $N_2O$ include $NO_2$ and O but, because of their very low mole fractions in the process chamber, these minor byproducts are not thought to significantly contribute to a substrate oxidation process and, therefore, were not considered further. The results in FIG. 2 indicate that thermal decomposition of a process gas consisting of 10 slm $N_2O$ yields the equivalent of 6.56 slm $N_2$, 3.23 slm $O_2$, and 0.203 slm NO in the process chamber 12.

The chemical modeling described above was further utilized to calculate NO molar concentrations (FIG. 3A), $O_2$ molar concentration (FIG. 3B), $O_2$/NO molar ratio (FIG. 4A), and gas temperature (FIG. 4B) as a function of the distance from the gas injection end of the process chamber 12 (FIG. 1) for four $N_2O$-based process gases and one NO-based process gas. The $N_2O$-based process gases included 1) 10 slm $N_2O$, 2) 5 slm $N_2O$, 3) 5 Slm $N_2O$ +5 slm $N_2$, and 4) 5 slm $N_2O$+5 slm $N_2$+5 slm $O_2$. The NO-based process gas included 6.6 slm $N_2$+3.3 slm $O_2$+0.21 slm $O_2$.

Figure 3A:
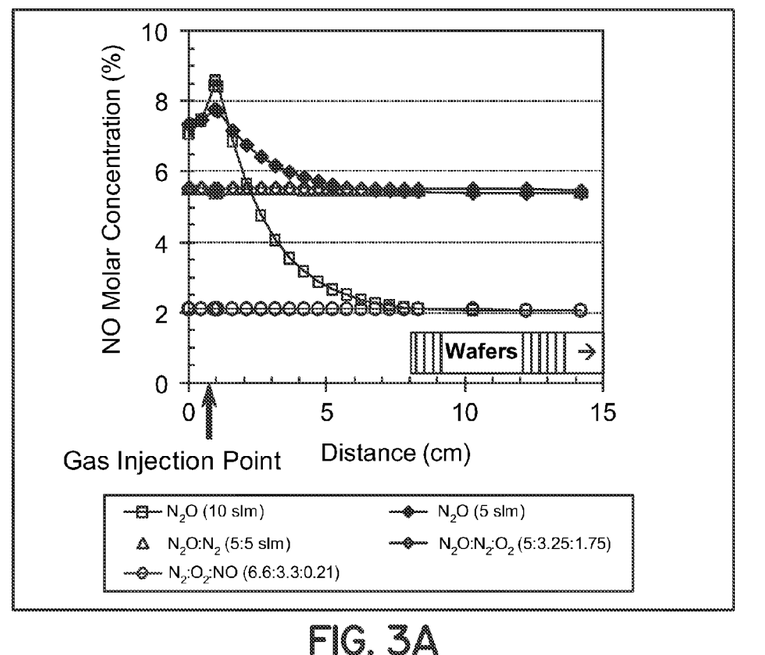
FIG. 3A shows NO molar concentrations in a process chamber for $N_2O$-based and NO-based process gases according to an embodiment of the invention.

FIG. 3A shows NO molar concentrations in a process chamber for $N_2O$-based and NO-based process gases according to an embodiment of the invention. Also depicted are the gas injection point and a typical position of a substrate holder configured for supporting a plurality of wafers during processing. FIG. 3A shows that a process gas consisting of 10 slm $N_2O$ yielded a NO molar concentration that peaks at about 8.5% near the gas injection point but reached a steady state NO molar concentration of about 2% at a distance of about 8 cm from the gas injection point. Furthermore, a process gas consisting of 5 slm $N_2O$ yielded a NO molar concentration that peaks at about 7.5% near the gas injection point but reached a steady state concentration of about 5.5% at a distance of about 8 cm from the gas injection point.

The chemical modeling results in FIG. 3A demonstrate the highly exothermic nature of the $N_2O$ thermal decomposition reaction and how the relative $N_2O$ gas flow (10 slm vs. 5 slm) through the process chamber can significantly affect the NO molar concentration and, thus, the oxidation environment in the process chamber. In this example, a lower $N_2O$ flow yielded a lower peak NO molar concentration but higher steady state NO molar concentration. Furthermore, a process gas containing $N_2O$ diluted with $N_2$ (5 slm $N_2O$+5 slm $N_2$) yielded a steady state NO molar concentration of about 5.5%, but without the significant peak near the gas injection point that was observed for the undiluted $N_2O$ process gases described above. In addition, a process gas containing $N_2O$ diluted with $N_2$ and $O_2$ (5 slm $N_2O$+5 slm $N_2$+5 slm $O_2$) yielded a similar NO molar concentration profile as the process gas containing $N_2O$ diluted with $N_2$. In FIG. 3A, the composition of the NO-based process gas containing $N_2$, $O_2$, and NO (6.6 slm $N_2$+3.3 slm $O_2$+0.21 slm $O_2$) was chosen to mimic the $N_2O$ byproducts described in FIG. 1 for a process gas of 10 slm $N_2O$.

Figure 3B:
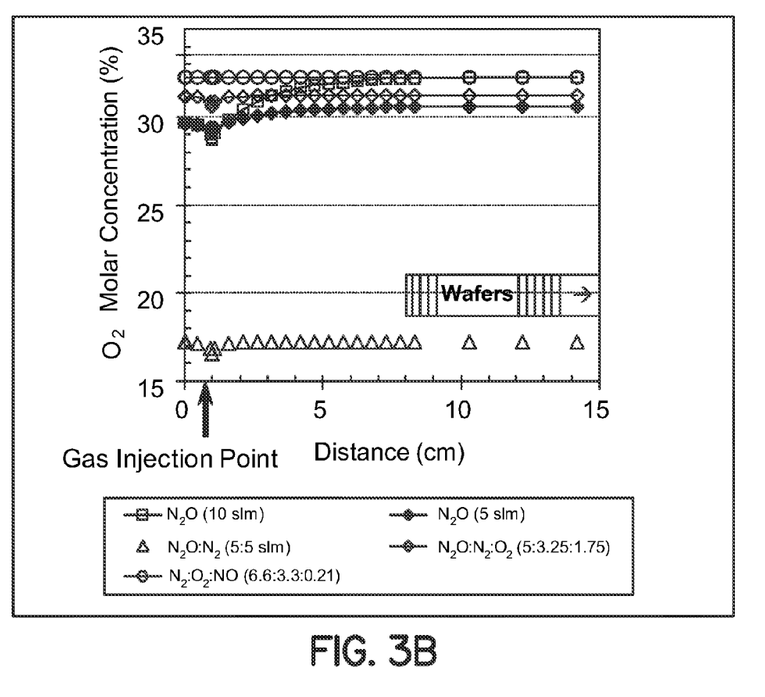
FIG. 3B shows $O_2$ molar concentrations in a process chamber for $N_2O$-based and NO-based process gases according to an embodiment of the invention.

FIG. 3B shows $O_2$ molar concentrations in a process chamber for $N_2O$-based and NO-based process gases according to an embodiment of the invention. FIG. 3B shows that a process gas consisting of 10 slm $N_2O$ yielded a $O_2$ molar concentration that varied from about 29% near the gas injection point but reached a steady state $O_2$ molar concentration of about 32% at a distance of about 8 cm from the gas injection point. Furthermore, a process gas consisting of 5 slm $N_2O$ yielded an $O_2$ molar concentration that varied from about 29% near the gas injection point but reached a steady state concentration of about 30.5% at a distance of about 8 cm from the gas injection point. In this example, a lower $N_2O$ flow yielded a similar $O_2$ molar concentration near the gas injection point but a different steady state $O_2$ molar concentration. Furthermore, a process gas containing $N_2O$ diluted with $N_2$ (5 slm $N_2O$+5 slm $N_2$) yielded a steady state $O_2$ molar concentration of only about 17%. In addition, a process gas containing $N_2O$ diluted with $N_2$ and $O_2$ (5 slm $N_2O$+5 slm $N_2$+5 slm $O_2$) yielded an $O_2$ molar concentration of about 31%.

Figure 4A:
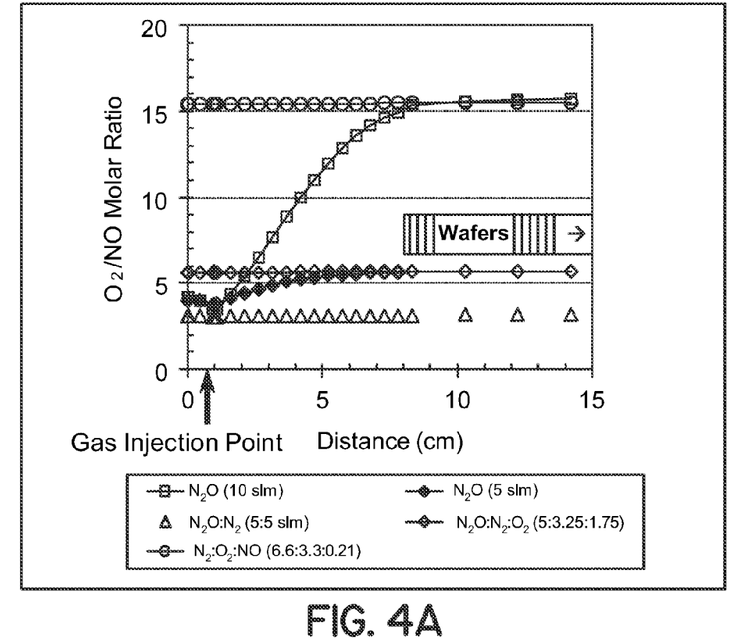
FIG. 4A shows $O_2$/NO molar ratios in a process chamber for $N_2O$-based and NO-based process gases according to an embodiment of the invention.

FIG. 4A shows $O_2$/NO molar ratios in a process chamber for $N_2O$-based and NO-based process gases according to an embodiment of the invention. The $O_2$/NO molar ratios were determined from the NO molar concentration data in FIG. 3A and the corresponding $O_2$ molar concentration data in FIG. 3B, respectively. FIG. 4A shows that the $O_2$/NO molar ratio of the NO-based process gas mimics the $O_2$/NO molar ratio of 10 slm $N_2O$ under steady state conditions.

Figure 4B:
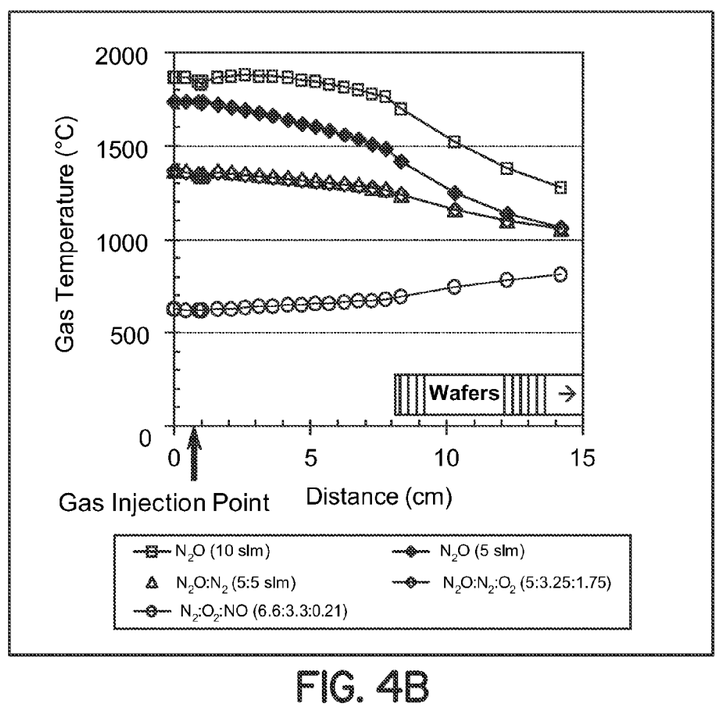
FIG. 4B shows gas temperature in a process chamber for $N_2O$-based and NO-based process gases according to an embodiment of the invention.

FIG. 4B shows gas temperature in a process chamber for $N_2O$-based and NO-based process gases according to an embodiment of the invention. The results in FIG. 4B show that the gas temperature T in the process chamber for the different $N_2O$-based and NO-based process gas proceeds as T(10 slm $N_2O$)>T(5 slm $N_2O$)>T(5 slm $N_2O$+5 slm $N_2$)~T(5 slm $N_2O$+3.25 slm $N_2$+1.75 slm $O_2$)>T(6.6 slm $N_2$+3.3 slm $O_2$+0.21 slm NO). The results in FIG. 4B demonstrate that the gas temperature, and thus the oxidation environment, is highly dependant on the $N_2O$-based process gas composition and the process gas flow. In particular, a gas temperature as high as about 1900° C. is calculated for 10 slm $N_2O$, about 1700° C. for 10 slm $N_2O$, and about 1350° C. for 5 slm $N_2O$+5 slm $N_2$ and 5 slm $N_2O$+3.25 slm $N_2$+1.75 slm $O_2$. In comparison, the gas temperature of the NO-based process gas is much lower than the $NO_2$-based process gas (i.e., from about 600° C. to about 800° C.).

As shown in FIGS. 3A and 3B, a $N_2O$-based process gas consisting of a $N_2O$ flow of 10 slm can be replaced by an equivalent NO-based process gas containing 6.6 slm $N_2$+3.3 slm $O_2$+0.21 slm NO. Although not shown in FIGS. 3A and 3B, it is apparent that a $N_2O$-based process gas consisting of a $N_2O$ flow of 5 slm can be replaced by an equivalent NO-based process gas containing 3.2 slm $N_2$+1.52 slm $O_2$+0.28 slm NO.

Table 1 summarizes the results of FIGS. 3A, 3B, and 4A. Table 1 shows the equivalent $N_2$, $O_2$, and NO molar concentrations for each of the four $N_2O$-based process gases and the NO-based process gas. For example, a process gas consisting of 10 slm $N_2O$ thermally decomposes to 66% (6.6 slm) $N_2$, 32% (3.2 slm) $O_2$, and 2% (0.2 slm) NO.

TABLE 1

| Process gas (slm) | $N_2$ | $O_2$ | NO |
|---|---|---|---|
| 10 slm $N_2O$ | 66% (6.6 slm) | 32% (3.2 slm) | 2% (0.2 slm) |
| 5 slm $N_2O$ | 64% (3.2 slm) | 30.5% (1.52 slm) | 5.5% (0.28 slm) |
| 5 slm $N_2O$ + 5 slm $N_2$ | 77.5% (7.75 slm) | 17% (1.7 slm) | 5.5% (0.55 slm) |
| 5 slm $N_2O$ + 3.25 slm $N_2$ + 1.75 slm $O_2$ | 63.5% (6.35 slm) | 31% (1.52 slm) | 5.5% (0.55 slm) |
| 6.6 slm $N_2$ + 3.3 slm $N_2$ + 0.21 slm NO | 65% (6.6 slm) | 33% (3.3 slm) | 2% (0.21 slm) |

In summary, the chemical modeling results presented in FIGS. 2-4B demonstrate that $N_2O$ thermal decomposition yields $N_2$, $O_2$, and NO byproducts with an important composition gradient and decomposition temperature (gas temperature) gradient along a significant portion of the length of the process chamber. Furthermore, the relative concentrations of the $N_2$, $O_2$, and NO byproducts are a function of $N_2O$ gas flow, $N_2O$ concentration in the process gas, and the gas temperature. This explains the tool-to-tool variability. Furthermore, the chemical modeling demonstrates that an equivalent NO-based process gas containing $N_2$, $O_2$, and NO gas may be selected for each $N_2O$-based process gas and that the molar concentrations of $O_2$ and NO in the NO-based process gas is only weakly dependant on system design.

According to another embodiment of the invention, direct measurement of the byproducts of the $N_2O$-based oxidation process in the process chamber may be utilized to generate an equivalent NO-based oxidation process. In one example, the molar concentrations of $N_2$, $O_2$, and NO byproducts in the gaseous environment in the process chamber may be measured by mass spectroscopy, by light absorption, or by light emission techniques. These analytical techniques are well known to those skilled in the art.

According to another embodiment of the invention, a NO-based oxidation process to replace a $N_2O$-based oxidation process may be determined by performing oxidation processes on substrates using $N_2O$-based and NO-based oxidation processes, and subsequently comparing the oxidation results. The oxidation processes may include forming a base oxynitride layer on a substrate or performing a reoxidation process on a substrate containing an oxide or oxynitride layer formed thereon.

In the example shown in Table 2, different NO-based process gases containing $N_2$, $O_2$, and NO were utilized in oxidation processes and compared to that of a process gas consisting of 5 slm $N_2O$. The oxidation process conditions included a process chamber temperature of 900° C., a process gas pressure of 615 Torr in the process chamber, and a 15 minute exposure time.

TABLE 2

| NO (slm) | $O_2$ (slm) | $N_2$ (slm) | Time (min) | $O_2$/NO | NO % | $O_2$ % |
|---|---|---|---|---|---|---|
| 0.15 | 1.6 | 3.25 | 15 | 10.67 | 3 | 32 |
| 0.20 | 1.6 | 3.20 | 15 | 8.00 | 4 | 32 |
| 0.25 | 1.6 | 3.15 | 15 | 6.40 | 5 | 32 |
| 0.30 | 1.6 | 3.10 | 15 | 5.33 | 6 | 32 |
| 0.35 | 1.6 | 3.05 | 15 | 4.57 | 7 | 32 |
| $N_2O$ = 5 | | | 15 | | | |

Figure 5A:
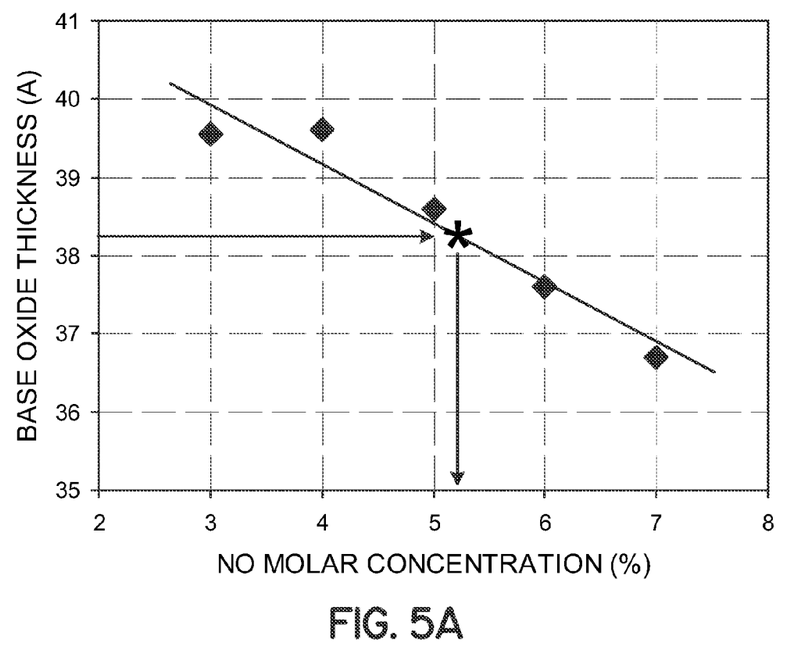
FIG. 5A compares base oxide thickness of a $N_2O$-based oxidation process to different NO-based oxidation processes according to an embodiment of the invention.
Figure 5B:
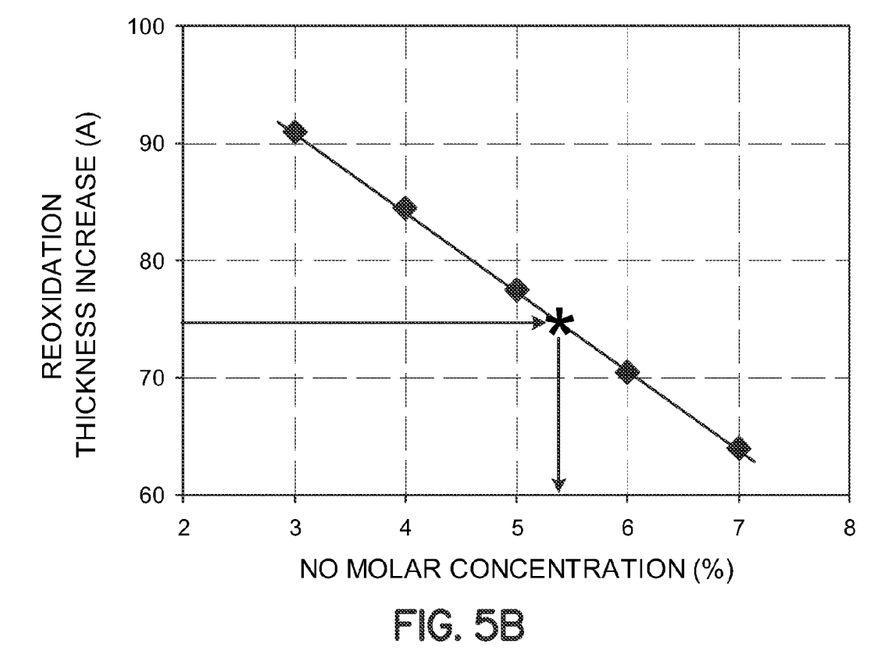
FIG. 5B compares reoxidation thickness of a $N_2O$-based oxidation process to different NO-based oxidation processes according to an embodiment of the invention.

FIG. 5A compares base oxide thickness of a $N_2O$-based oxidation process to different NO-based oxidation processes according to an embodiment of the invention. FIG. 5A shows that the base oxide thickness using a 5 slm $N_2O$ process gas was closely approximated by a NO-based process gas containing about 5.25% molar concentration of NO, 32% concentration of $O_2$, and balance $N_2$. FIG. 5B compares reoxidation thickness of a $N_2O$-based oxidation process to different NO-based oxidation processes according to an embodiment of the invention. The reoxidation process was performed by exposing oxynitride films formed by $N_2O$-based oxidation and NO-based oxidation to an $O_2$ ambient at a pressure of one atmosphere for 30 min. Then, the resulting films thickness was measured again and the reoxidation thickness increase calculated and plotted in FIG. 5B. The reoxidation thickness increase is directly proportional to the amount of nitrogen at the interface of the oxynitride film and the substrate.

FIGS. 5A and 5B shows that the base oxide thickness and the reoxidation thickness increase using a 5 slm $N_2O$ process gas was closely approximated by a NO-based process gas containing about 5.25% and about 5.5% molar concentration of NO, respectively. This is also good agreement with the results of the chemical modeling results from FIGS. 3A and 3B, where a 5 slm $N_2O$ process gas yielded about 5.5% steady state molar concentration of NO and about 32% steady state molar concentration of $O_2$. Therefore, the chemical modeling agrees well with tool data displayed in FIGS. 5A and 5B.

Figure 6:
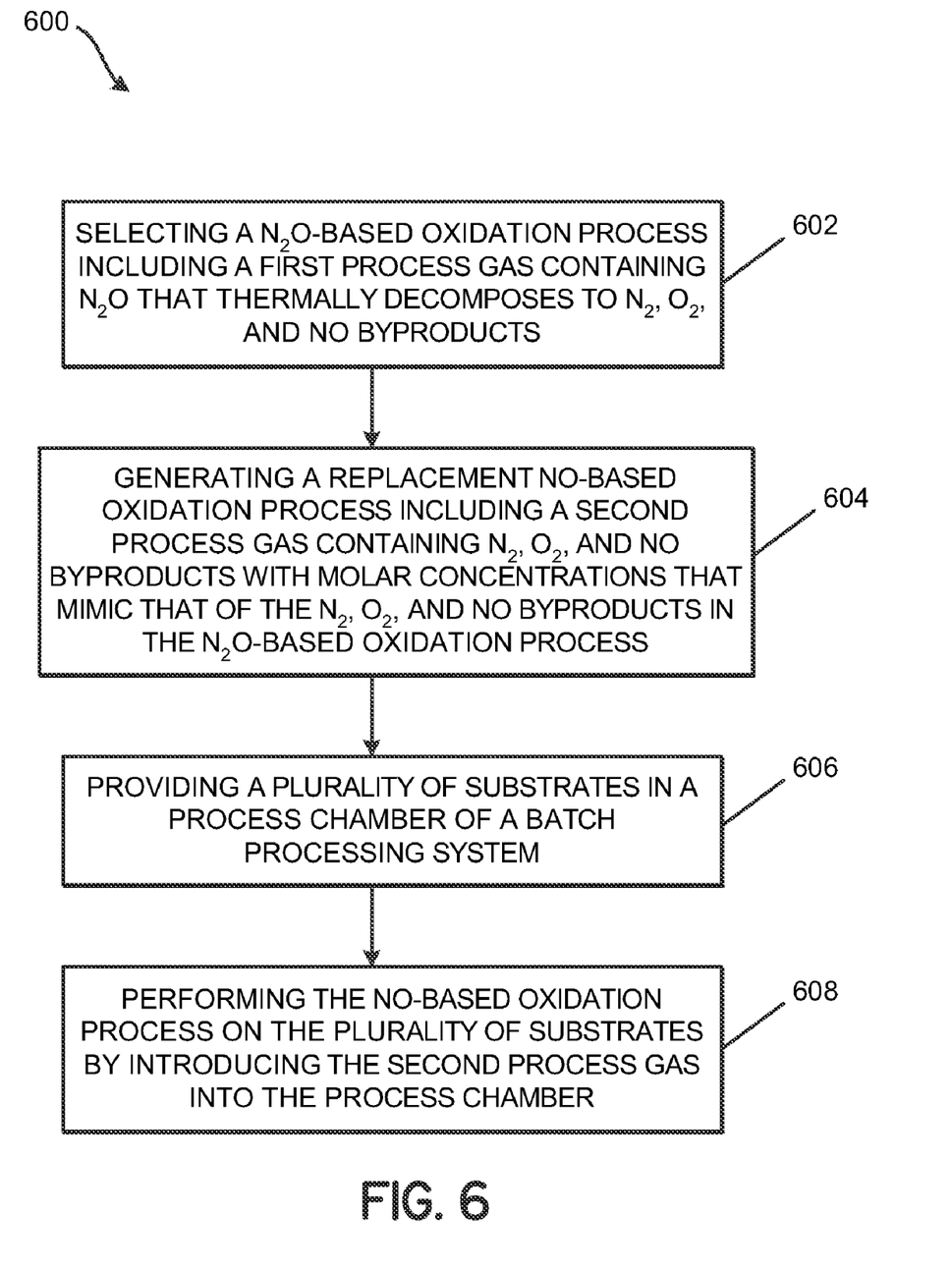
FIG. 6 is a process flow diagram of a method for performing an oxidation process on a plurality of substrates according to an embodiment of the invention.

FIG. 6 is a process flow diagram of a method for performing an oxidation process on a plurality of substrates according to an embodiment of the invention. The process 600 includes, in step 602, selecting an $N_2O$-based oxidation process including a first process gas containing $N_2O$ that thermally decomposes to $N_2$, $O_2$, and NO byproducts. According to one embodiment of the invention, the $N_2O$-based process gas contains undiluted $N_2O$ gas.

In step 604, a replacement NO-based oxidation process is generated that includes a second process gas containing $N_2$, $O_2$, and NO with molar concentrations that mimic that of the $N_2$, $O_2$, and NO byproducts in the $N_2O$-based oxidation process. According to one embodiment of the invention, the second process gas may include 1%-10% NO, 10%-50% $O_2$, and balance $N_2$. According to another embodiment of the invention, second process gas may include 1%-3% NO, 20%-40% $O_2$, and balance $N_2$.

In step 606, a plurality of substrates is provided in a process chamber of a batch processing system. The substrates can be clean of any oxide layer, or alternately, the substrates can contain a base oxide or oxynitride layer. The batch processing system can, for example, process substrates of any size, such as 200 mm substrates, 300 mm substrates, or even larger substrates. Furthermore, the processing system can simultaneously process up to about 200 substrates, or more. Alternatively, the processing system can simultaneously process up to about 25 substrates.

In step 608, a NO-based oxidation process is performed on the plurality of substrates by introducing the second process gas into the chamber. The oxidation process can form an oxynitride layer on clean substrates, or alternately, the oxidation process can be a reoxidation process performed on oxide or oxynitride layers. For example, the process conditions can include a process chamber temperature between about 600° C. and about 1000° C., and a process chamber pressure between about 100 mtorr and about 650 Torr.

Figure 7:
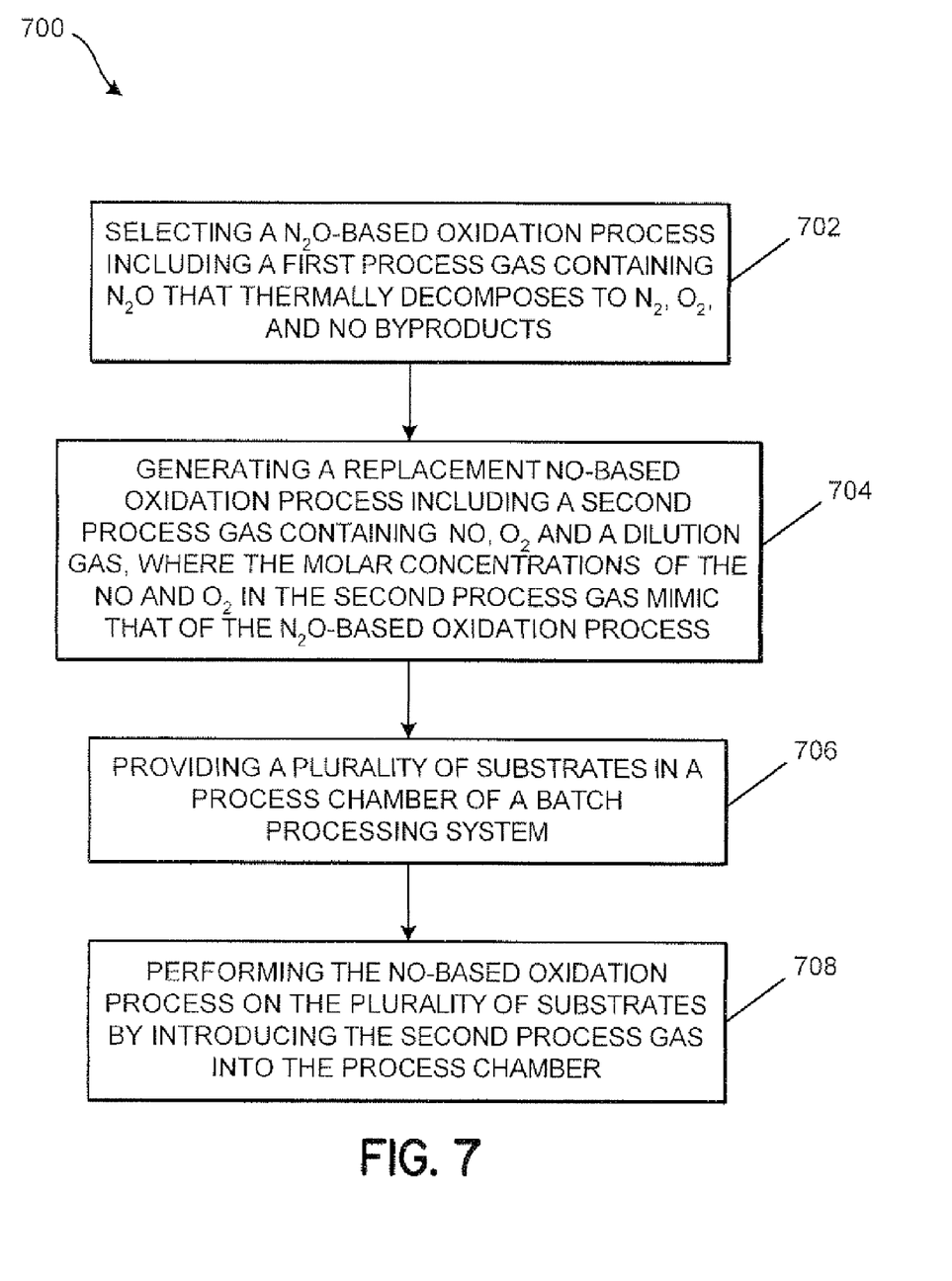
FIG. 7 is a process flow diagram of a method for performing an oxidation process on a plurality of substrates according to another embodiment of the invention.

FIG. 7 is a process flow diagram of a method for performing an oxidation process on a plurality of substrates according to another embodiment of the invention. The process 700 includes, in step 702, selecting an $N_2O$-based oxidation process including a first process gas containing $N_2O$ that thermally decomposes to $N_2$, $O_2$, and NO byproducts. According to one embodiment of the invention, the first process gas contains undiluted $N_2O$ gas. According to another embodiment of the invention, the first process gas contains $N_2O$ gas and at least one of $N_2$ or $O_2$.

In step 704, a replacement NO-based oxidation process is generated that includes a second process gas containing NO, $O_2$, and a dilution gas, wherein the molar concentrations of NO and $O_2$ in the second process gas mimic that of the $N_2O$-based oxidation process. According to one embodiment of the invention, the first process gas contains undiluted $N_2O$ gas. According to another embodiment of the invention, the first process gas contains $N_2O$ gas and at least one of $N_2$, $O_2$, or Ar. According to an embodiment of the invention, the dilution gas can contain Ar. According to one embodiment of the invention, the second process gas can include 1%-10% NO, 10%-50% $O_2$, and balance dilution gas. According to another embodiment of the invention, second process gas can include 1%-3% NO, 20%-40% $O_2$, and balance dilution gas. The dilution gas can contain at least one of $N_2$ or Ar.

In step 706, a plurality of substrates is provided in a process chamber of a batch processing system. The substrates can be clean of any oxide layer, or alternately, the substrates can contain a base oxide or oxynitride layer.

In step 708, a NO-based oxidation process is performed on the plurality of substrates by introducing the second process gas into the chamber. The oxidation process can form an oxynitride layer on clean substrates, or alternately, the oxidation process can be a reoxidation process performed on oxide or oxynitride layers. For example, the process conditions can include a process chamber temperature between about 600° C. and about 1000° C., and a process chamber pressure between about 100 mtorr and about 650 Torr.

Process gas delivery and cost comparison between $N_2O$-based and NO-based oxidation processes show that NO gas delivery is slightly more difficult than $N_2O$ gas due to the more corrosive nature of NO and NO gas is more expensive (currently ~4.9×) than $N_2O$ gas. However, when replacing an $N_2O$ gas with NO gas, the actual cost of the NO gas is much lower than that of $N_2O$ since proportionally much less NO gas is used than $N_2O$ gas. For example, a 10 slm $N_2O$ process gas flow may be replaced by a NO-based process gas containing 2% NO. In another example, 5 slm $N_2O$ process gas flow may be replaced by a NO-based process gas containing 5.5% NO.

While the present invention has been illustrated by description of one or more embodiments thereof, and while the embodiments have been described in considerable detail, they are not intended to restrict or in any way limit the scope of the appended claims to such detail. Additional advantages and modifications will readily appear to those skilled in the art. The invention in its broader aspects is therefore not limited to the specific details, representative apparatus and method and illustrative examples shown and described. Accordingly, departures may be made from such details without departing from the scope of the general inventive concept.

What is claimed is:

1. A method for processing a plurality of substrates in a batch processing system, the method comprising:
    selecting a $N_2O$-based oxidation process for the substrates comprising a first process gas containing $N_2O$ that thermally decomposes in a process chamber of the batch processing system to $N_2$, $O_2$, and NO byproducts; and
    generating a replacement NO-based oxidation process for the substrates comprising a second process gas containing $N_2$, $O_2$, and NO with molar concentrations that are substantially identical to the $N_2$, $O_2$, and NO byproducts in the $N_2O$-based oxidation process for use in forming an oxynitride layer on each of the substrates as a substitute for the $N_2O$-based oxidation process.

2. The method according to claim 1, wherein generating the replacement NO-based oxidation process further comprises:
    determining molar concentrations of the $N_2$, $O_2$, and NO byproducts from the thermal decomposition of the first process gas in the process chamber; and
    forming the second process gas based on the determined molar concentrations.

3. The method according to claim 2, wherein determining the molar concentrations comprises:
    calculating by chemical modeling molar concentrations of the $N_2$, $O_2$, and NO byproducts in the process chamber.

4. The method according to claim 2, wherein determining the molar concentrations comprises:
    analytically measuring molar concentrations of the $N_2$, $O_2$, and NO byproducts in the process chamber.

5. The method according to claim 2, wherein determining the molar concentrations comprises:
    performing a $N_2O$-based oxidation process yielding a first substrate oxidation or reoxidation thickness;
    performing a plurality of NO-based oxidation processes using different molar concentrations of $N_2$, $O_2$, and NO in the process chamber each yielding a second substrate oxidation or reoxidation thickness; and
    selecting the replacement NO-based oxidation process by comparing the first and second substrate oxidation or reoxidation thicknesses of the $N_2O$-based and NO-based oxidation processes.

6. The method according to claim 1, wherein the second process gas comprise 1%-10% NO, 10% -50% $O_2$, and balance $N_2$.

7. The method according to claim 1, wherein the second process gas comprises 1%-3% NO, 20% -40% $O_2$, and balance $N_2$.

8. The method according to claim 1, wherein selecting the $N_2O$-based oxidation process further comprises:
    choosing a composition of the first process gas, a gas flow rate of the first process gas, a process chamber pressure, and a process chamber temperature.

9. The method according to claim 1, further comprising:
    placing the substrates in the process chamber of the batch processing system; and
    performing the NO-based oxidation process on the substrates by introducing the second process gas into the process chamber.

10. A method for processing a plurality of substrates in a batch processing system, the method comprising:
    selecting a $N_2O$-based oxidation process for the substrates comprising a first process gas containing $N_2O$ that thermally decomposes in a process chamber of the batch processing system to $N_2$, $O_2$, and NO byproducts; and
    generating a replacement NO-based oxidation process for the substrates comprising a second process gas containing NO, $O_2$, and a dilution gas, wherein the molar concentrations of NO and $O_2$ in the second process gas are substantially identical to the $N_2O$-based oxidation process for use in forming an oxynitride layer on each of the substrates as a substitute for the $N_2O$-based oxidation process.

11. The method according to claim 10, wherein the first process gas comprises undiluted $N_2O$.

12. The method according to claim 10, wherein the first process gas comprises a mixture of $N_2O$ and at least one of $N_2$, $O_2$, or Ar.

13. The method according to claim 10, wherein the dilution gas comprises at least one of $N_2$ or Ar.

14. The method according to claim 10, wherein generating the replacement NO-based oxidation process comprises:
   determining molar concentrations of the $N_2$, $O_2$, and NO byproducts from the thermal decomposition of the first process gas in the process chamber; and
   forming the second process gas based on the determined molar concentrations.

15. The method according to claim 14, wherein determining the molar concentrations comprises:
   calculating by chemical modeling molar concentrations of the $N_2$, $O_2$, and NO byproducts in the process chamber.

16. The method according to claim 14, wherein determining the molar concentrations comprises:
   analytically measuring molar concentrations of the $N_2$, $O_2$, and NO byproducts in the process chamber.

17. The method according to claim 14, wherein determining the molar concentrations comprises:
   performing a $N_2O$-based oxidation process yielding a first substrate oxidation or reoxidation thickness;
   performing a plurality of NO-based oxidation processes using different molar concentrations of NO, $O_2$, and the dilution gas in the process chamber each yielding a second substrate oxidation or reoxidation thickness; and
   selecting the replacement NO-based oxidation process by comparing the first and second substrate oxidation or reoxidation thicknesses of the $N_2O$-based and NO-based oxidation processes.

18. The method according to claim 10, wherein the second process gas comprises 1%-10% NO, 10%- 50% $O_2$, and balance the dilution gas.

19. The method according to claim 10, wherein the second process gas comprises 1%- 3% NO, 20% 40% $O_2$, and balance the dilution gas.

20. The method according to 10, wherein selecting the $N_2O$-based oxidation process further comprises:
   choosing a composition of the first process gas, a gas flow rate of the first process gas, a process chamber pressure, and a process chamber temperature.

21. The method according to claim 10, further comprising:
   placing the substrates in the process chamber of the batch processing system; and
   performing the NO-based oxidation process on the substrates by introducing the second process gas into the process chamber.

* * * * *

UNITED STATES PATENT AND TRADEMARK OFFICE
CERTIFICATE OF CORRECTION

PATENT NO. : 7,635,655 B2  Page 1 of 1
APPLICATION NO. : 11/278054
DATED : December 22, 2009
INVENTOR(S) : Anthony Dip It is certified that error appears in the above-identified patent and that said Letters Patent is hereby corrected as shown below:

In column 3:
Line 18, change "is" to --are--.
Line 56-57, after "thermally decomposes", delete "thermally decomposes".

In column 5, line 6, after "wafers", delete "having".

In column 7, line 28, change "is" to --are--.

In column 8:
Line 17, change "shows" to --show--.
Line 62, change "mtorr" to --mTorr--.

In column 9, line 33, change "mtorr" to --mTorr--.

In column 10, line 31, Claim 6, change "comprise" to --comprises--.

In column 12:
Line 9, Claim 19, after "20%", insert -- - --.
Line 11, Claim 20, after "to", insert --claim--.

Signed and Sealed this

Eighteenth Day of May, 2010

David J. Kappos
*Director of the United States Patent and Trademark Office*

UNITED STATES PATENT AND TRADEMARK OFFICE
CERTIFICATE OF CORRECTION

| | |
|---|---|
| PATENT NO. | : 7,635,655 B2 |
| APPLICATION NO. | : 11/278054 |
| DATED | : December 22, 2009 |
| INVENTOR(S) | : Anthony Dip |

Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 752 days.

Signed and Sealed this

Ninth Day of November, 2010

David J. Kappos
*Director of the United States Patent and Trademark Office*